(12) United States Patent
Lee et al.

(10) Patent No.: US 7,796,415 B2
(45) Date of Patent: Sep. 14, 2010

(54) MAGNETIC LAYER, METHOD OF FORMING THE MAGNETIC LAYER, INFORMATION STORAGE DEVICE INCLUDING THE MAGNETIC LAYER, AND METHOD OF MANUFACTURING THE INFORMATION STORAGE DEVICE

(75) Inventors: Sung-chul Lee, Osan-si (KR); Sun-ae Seo, Hwaseong-si (KR); Young-Jin Cho, Suwon-si (KR); Kwang-seok Kim, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 12/073,105

(22) Filed: Feb. 29, 2008

(65) Prior Publication Data
US 2009/0097365 A1    Apr. 16, 2009

(30) Foreign Application Priority Data
Oct. 12, 2007    (KR) .................. 10-2007-0103167

(51) Int. Cl.
*G11C 19/00* (2006.01)
(52) U.S. Cl. ............................. 365/81; 365/80; 365/87; 365/130; 365/158; 365/171; 977/933
(58) Field of Classification Search ................ 365/148, 365/158, 48, 55, 62, 66, 74, 78, 80–93, 100, 365/130, 131, 171–173, 225.5, 243.5; 257/421, 257/E21.665; 438/3; 977/933–935; 216/22; 483/3
See application file for complete search history.

(56) References Cited

U.S. PATENT DOCUMENTS

| 2005/0018478 A1* | 1/2005 | Nagase et al. ............... 365/171 |
| 2005/0078509 A1* | 4/2005 | Parkin ........................ 365/158 |
| 2006/0120132 A1  | 6/2006 | Parkin |

OTHER PUBLICATIONS

Magnetically Engineered Spintronic Sensors and Memory, by S. Parkin et al., Proceedings of the IEEE, vol. 91, No. 5, May 2003, pp. 661-680.*
Development of the magnetic tunnel junction MRAM at IBM: From first junctions to a 16-Mb MRAM demonstrator chip, by Gallagher and Parkin, IBM J. Res. & Dev. vol. 50 No. 1 Jan. 2006, pp. 5-23.*

* cited by examiner

*Primary Examiner*—Richard Elms
*Assistant Examiner*—Harry W Byrne
(74) *Attorney, Agent, or Firm*—Harness, Dickey & Pierce, P.L.C.

(57) ABSTRACT

Provided are a magnetic layer, a method of forming the magnetic layer, an information storage device, and a method of manufacturing the information storage device. The information storage device may include a magnetic track having a plurality of magnetic domains, a current supply element connected to the magnetic layer and a reading/writing element. The magnetic track includes a hard magnetic track, and the hard magnetic track has a magnetization easy-axis extending in a direction parallel to a width of the hard magnetic track.

20 Claims, 6 Drawing Sheets

MAGNETIC LAYER, METHOD OF FORMING THE MAGNETIC LAYER, INFORMATION STORAGE DEVICE INCLUDING THE MAGNETIC LAYER, AND METHOD OF MANUFACTURING THE INFORMATION STORAGE DEVICE

PRIORITY STATEMENT

This application claims the benefit of Korean Patent Application No. 10-2007-0103167, filed on Oct. 12, 2007, in the Korean Intellectual Property Office, the disclosure of which is incorporated herein in its entirety by reference.

BACKGROUND

1. Field

Example embodiments relate to a magnetic layer, a method of forming the magnetic layer, an information storage device, and a method of manufacturing an information storage device. More particularly, example embodiments relate to a magnetic layer that can increase recording density, a method of forming the magnetic layer, an information storage device using magnetic domain movement and including the magnetic layer, and a method of manufacturing the information storage device.

2. Description of the Related Art

A flash memory is an example non-volatile memory, which has been used in various applications. Generally, flash memory has a low operating speed and short lifetime. To overcome such problems, other memories such as a magnetic random access memory (MRAM), a ferroelectric random access memory (FRAM), a phase-change random access memory (PRAM), a resistive random access memory (RRAM), etc., have been introduced. However, these other memories generally include and/or require switching elements connected to respective memory cells and thus, it is difficult to increase an integration degree of these other memories.

An information storage device using magnetic domain wall movement has been introduced. This information storage device is a new non-volatile information storage device in which a switching element connected to a memory cell is generally not used and/or required.

A minute magnetic region that constitutes a magnetic body is referred to as a magnetic domain. The direction of magnetic moments in a magnetic domain is identical. A magnetic domain wall is a boundary portion of a magnetic domain having a magnetization direction different from another magnetic domain. The magnetic domain wall has a desired and/or predetermined volume. The magnetic domain and the magnetic domain wall can be moved in a magnetic body by an external magnetic field and/or by a current applied to the magnetic substance. Accordingly, based on the principle of movement of a magnetic domain wall and a magnetic domain, a switching element for controlling access to a memory cell of a non-volatile information storage device may not be required.

In this regard, U.S. Patent Publication No. 2006/0120132 discloses an example of an information storage device using the principle of magnetic domain wall movement.

The information storage device (hereinafter, a conventional storage device) disclosed in U.S. Patent Publication No. 2006/0120132 includes a magnetic track perpendicular to a substrate. The magnetic track is divided into a storage track and a buffer track having a length similar to that of the storage track. This conventional storage device also includes a writing element and a reading element, which are adjacent to the center of the magnetic track. A plurality of magnetic domains are serially disposed in the magnetic track, and have magnetic domain walls therebetween. When the magnetic domains and the magnetic domain walls are moved, a writing operation or a reading operation is performed using the writing element and the reading element.

However, the magnetic track of the conventional storage device is formed of a soft magnetic material such as NiFe. In this regard, since the thickness of a magnetic domain wall in the soft magnetic material is thick, that is, several hundreds of nanometers (nm), increasing the recoding density of the conventional storage device is difficult. Also, since a large amount of current of about $10^{12}$ A/m$^2$ is required to move a magnetic domain wall of a soft magnetic layer, the conventional storage device may have high power consumption. In addition, since only about ½ of the magnetic track is used as an available storage track, storing a large amount of information in the conventional storage device is difficult.

SUMMARY

Example embodiments of the present application provide a magnetic layer with an increased recording density and a method of forming the magnetic layer.

Example embodiments of the present application also provide an information storage device using magnetic domain wall movement and having a large storage capacity and low power consumption, as well as a method of manufacturing the information storage device.

An example embodiment of the present application provides a magnetic layer. The magnetic layer has a width and includes a hard magnetic material having a magnetization easy-axis extending in a direction parallel to the width of the magnetic layer.

According to an example embodiment, the magnetic layer may be arranged perpendicular to a substrate.

According to an example embodiment, the magnetic layer may be arranged parallel to and/or horizontally on a substrate.

According to an example embodiment, a magnetic anisotropic energy density (Ku) of the magnetic layer is within a range of about $10^4 \leq Ku \leq 10^8$ erg/cc.

Another example embodiment provides a method of forming a magnetic layer. The method may include forming a seed layer on a substrate, forming a magnetic layer including a hard magnetic material on the seed layer, and applying a magnetic field having a first direction parallel to the substrate when the magnetic layer is formed.

According to an example embodiment, a magnetic anisotropic energy density (Ku) of the hard magnetic material is within the range of about $10^4 \leq Ku \leq 10^8$ erg/cc.

According to an example embodiment, the magnetic layer may have a line shape and the first direction may extend in a direction parallel to a width of the magnetic layer.

Still another example embodiment provides an information storage device. The information storage device may include a magnetic track having a plurality of magnetic domains, a current supply element connected to the magnetic track, and a reading/writing element arranged to at least one of read data from the magnetic track and write data to the magnetic track. The magnetic track includes a hard magnetic material and has a magnetization easy-axis extending in a direction parallel to a width of the hard magnetic track.

Another example embodiment provides a method of forming the magnetic layer. The method may include forming a seed layer on a substrate, forming a magnetic layer including a hard magnetic material on the seed layer, and annealing the magnetic layer. The seed layer may have a crystal structure crystallizing the magnetic layer so that a magnetization easy-axis of the magnetic layer extends in a first direction parallel to the substrate during the annealing.

Another example embodiment provides a method of manufacturing an information storage device including a magnetic track having a plurality of magnetic domains, a current supply element connected to the magnetic track, and a reading/writing element. Forming the magnetic track includes forming a magnetic layer including a hard magnetic material using the above-described method.

Still another example embodiment provides an information storage device. The information storage device may include a magnetic track having a plurality of magnetic domains, a current supply element connected to the magnetic track and a reading/writing element arranged to at least one of read data from the magnetic track and write data to the magnetic track. The magnetic track includes a hard magnetic material, and the hard magnetic track has a magnetization easy-axis extending in a direction parallel to a width of the hard magnetic track.

According to an example embodiment, the hard magnetic track may include at least one perpendicular magnetic layer arranged perpendicular to a substrate.

According to an example embodiment, the hard magnetic track may include a horizontal magnetic layer arranged parallel to a substrate.

According to an example embodiment, the hard magnetic track may include a plurality of perpendicular magnetic layers, and at least one horizontal magnetic layer connecting the plurality of perpendicular magnetic layers. The plurality of perpendicular magnetic layers and the at least one horizontal magnetic layer have magnetization easy-axes parallel to each other.

According to an example embodiment, at least one of the plurality of the perpendicular magnetic layers may be a buffer layer.

According to an example embodiment, an information storage device may include a resistance magnetic layer arranged between each of the plurality of perpendicular magnetic layers and the at least one horizontal magnetic layer. The resistance magnetic layer has an electric resistance greater than that of each of the plurality of perpendicular magnetic layers and the at least one horizontal magnetic layer.

According to an example embodiment, the resistance magnetic layer may be one of a soft magnetic layer and a hard magnetic layer.

According to an example embodiment, a magnetic anisotropic energy density (Ku) of the hard magnetic track is within a range of about $10^4 \leq Ku \leq 10^8$ erg/cc.

According to an example embodiment, a current supply element of an example embodiment of an information storage device may be a transistor connected to an end of a perpendicular magnetic layer of the information storage device.

According to an example embodiment, the reading/writing element of the information storage device may be a single unit configured to both read data to and write data from the memory track.

According to an example embodiment, the single unit may include first and second hard magnetic pinned layers, which are formed on a bottom surface and a top surface of the magnetic track, respectively, and have magnetization directions opposite to each other; and first and second insulating layers interposed between the first and second hard magnetic pinned layers and the magnetic track, respectively.

According to an example embodiment, the reading/writing element of the information storage device may be a double unit including a writing component configured to only write data and a reading component configured to only read data.

Still another example embodiment provides a method of manufacturing an information storage device. The method may include forming a magnetic layer including a hard magnetic material; patterning the magnetic layer into a magnetic track having a plurality of magnetic domains; connecting a current supply element connected to the magnetic track; and providing a reading/writing element for reading from and writing data to the magnetic track.

BRIEF DESCRIPTION OF THE DRAWINGS

The above and other features and advantages of example embodiments will become more apparent by reviewing the following detailed description of example embodiments of this disclosure with reference to the attached drawings in which.

DETAILED DESCRIPTION OF EXAMPLE EMBODIMENTS

Figure 1A:
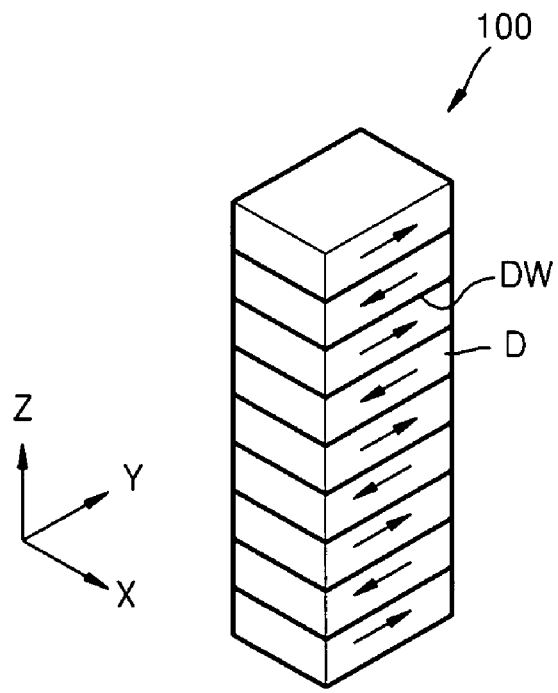
FIGS. 1A and 1B are schematic perspective views of a perpendicular magnetic track and a horizontal magnetic track, respectively, according to example embodiments of the present application.

Various example embodiments will now be described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the example embodiments set forth herein.

It should be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments described below with respect to the drawings are provided so that this disclosure will be thorough, complete and fully convey the concept of example embodiments to those skilled in the art. In the drawings, like numbers refer to like elements throughout. Further, the thicknesses of layers and regions are exaggerated for clarity in the drawings.

A magnetic layer, a method of forming the magnetic layer, an information storage device including the magnetic layer, and a method of manufacturing the information storage device will now be described more fully with reference to the accompanying drawings, in which example embodiments of the invention are shown.

Figure 1B:
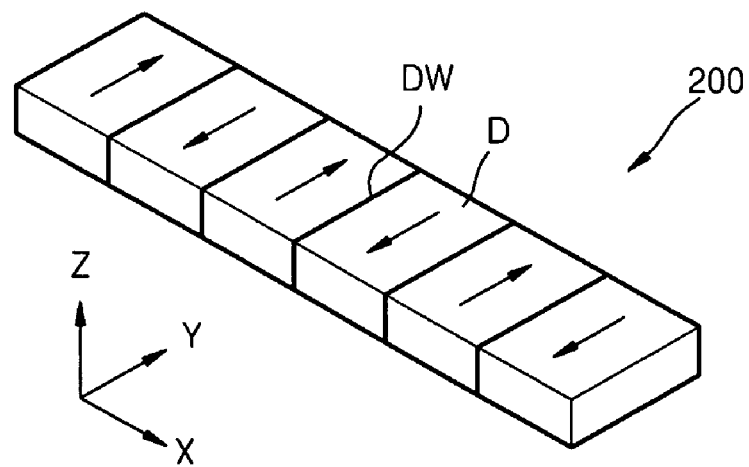

FIGS. 1A and 1B are schematic perspective views of a perpendicular magnetic track 100 and a horizontal magnetic track 200, respectively, according to example embodiments of the present application.

Both of the perpendicular magnetic track 100 of FIG. 1 and the horizontal magnetic track 200 of FIG. 2 are hard magnetic tracks. Each of the perpendicular magnetic track 100 and the horizontal magnetic track 200 has a plurality of magnetic domains Ds, which are serially disposed, and a plurality of magnetic domain walls DWs between the magnetic domains Ds. For example, the perpendicular magnetic track 100 and the horizontal magnetic track 200 may each be a track formed of a Co alloy (e.g., CoCrPt, CoCrTaPt or CoCrTa), or FePt having an $L1_0$ crystal structure. Further, each of the perpendicular magnetic track 100 and the horizontal magnetic track 200 may have a magnetic anisotropic energy density (Ku) within a range of about $10^4 \leq Ku \leq 10^8$ erg/cc. A hard magnetic material has an anisotropic magnetic field (Hk) greater than that of a soft magnetic material. An anisotropic magnetic field (Hk) is proportional to a magnetic anisotropic energy density (Ku), and is inversely proportional to a saturation magnetization (Ms). Accordingly, if any material has a great magnetic anisotropic energy density (Ku) and a small saturation magnetization (Ms), the material may have hard magnetic properties. In addition, although any material may have a small magnetic anisotropic energy density (Ku), if the material has a small saturation magnetization (Ms), the material may still have hard magnetic properties.

The perpendicular magnetic track 100 and the horizontal magnetic track 200 have magnetization easy-axes extending in directions parallel to the widths of the perpendicular magnetic track 100 and the horizontal magnetic track 200, respectively. In FIGS. 1A and 1B, the widths of the perpendicular magnetic track 100 and the horizontal magnetic track 200 is measured in the Y-axis direction. Accordingly, in FIGS. 1A and 1B, the magnetization easy-axes extend in a direction parallel to a Y-axis direction. That is, the magnetic domains Ds of each of the perpendicular magnetic track 100 and the horizontal magnetic track 200 may be magnetized in the Y-axis arrow direction or a direction opposite to the Y-axis arrow direction shown in FIGS. 1A and 1B. In FIGS. 1A and 1B, the magnetization directions of the magnetic domains Ds are indicated by arrows. Although not illustrated in FIGS. 1A and 1B, a seed layer may be disposed on a bottom surface of each of the perpendicular magnetic track 100 and the horizontal magnetic track 200. The seed layer may be a Cr layer or a $Mn_3Si$ layer, or alternatively, may be another material layer.

The thickness of a magnetic domain wall of a hard magnetic track is small. For example, the thickness of a magnetic domain wall of a hard magnetic track may be several through several tens of nanometers (nm). A current density required for moving a magnetic domain wall of a hard magnetic track is generally smaller than a current density required for moving a magnetic domain wall of a soft magnetic track. For example, the current density used and/or required for moving a magnetic domain wall of a hard magnetic track is about $10^{11}$ $A/m^2$ or less, whereas a current density required for moving a magnetic domain wall of a soft magnetic track is about $10^{12}$ $A/m^2$. In addition, data recorded on a hard magnetic track is stable against a thermal stimulus as compared with data recorded on a soft magnetic track. Accordingly, like in the cases illustrated FIGS. 1A and 1B, when a hard magnetic track is used in an information storage device, the information storage device can have an increased recording density, reduced power consumption, and improved reliability.

Figure 2A:
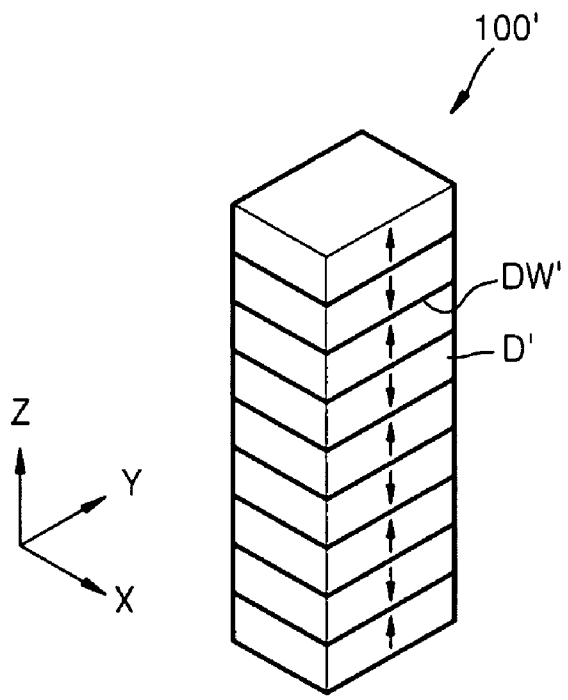
FIGS. 2A and 2B are schematic perspective views of a perpendicular magnetic track and a horizontal magnetic track, respectively, according to further example embodiments of the present application.
Figure 2B:
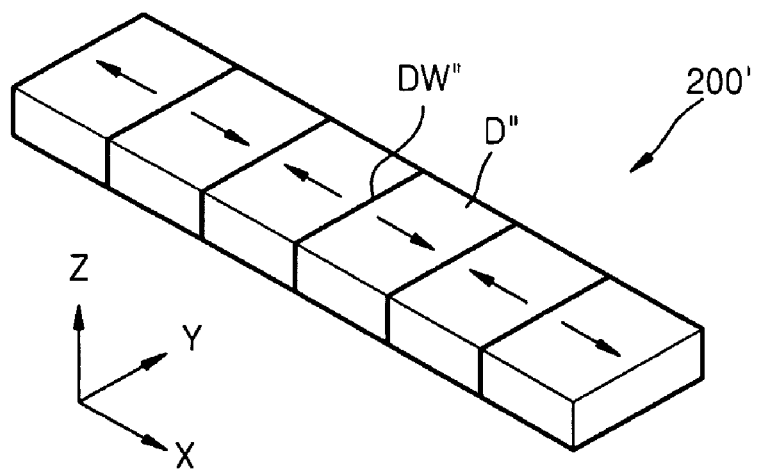

FIGS. 2A and 2B are schematic perspective views of a perpendicular magnetic track 100' and a horizontal magnetic track 200', respectively, according to further example embodiments of the present application. The example embodiments shown in FIGS. 2A and 2B are different from the example embodiments illustrated in FIGS. 1A and 1B with regard to the magnetization directions. In FIG. 2A, magnetization easy-axes of magnetic domains D's extend in a Z-axis direction. In FIG. 2B, magnetization easy-axes of magnetic domains D's extend in an X-axis direction.

As illustrated in FIG. 2A, if the magnetic domains D's of the perpendicular magnetic track 100' formed of a hard magnetic material each have a magnetization easy-axis extending in the Z-axis direction (e.g., when the magnetic domains D's of the perpendicular magnetic track 100' each have perpendicular magnetic anisotropy), the starting points (or, ending points) of adjacent arrows face each other. The arrows indicate magnetization directions. In FIG. 2B, if the magnetic domains D's of the horizontal magnetic track 200' formed of a hard magnetic material each have a magnetization easy-axis extending in the X-axis direction (e.g., when the magnetic domains D's of the horizontal magnetic track 200' each have horizontal magnetic anisotropy), the starting points (or, ending points) of adjacent arrows face each other.

Figure 3:
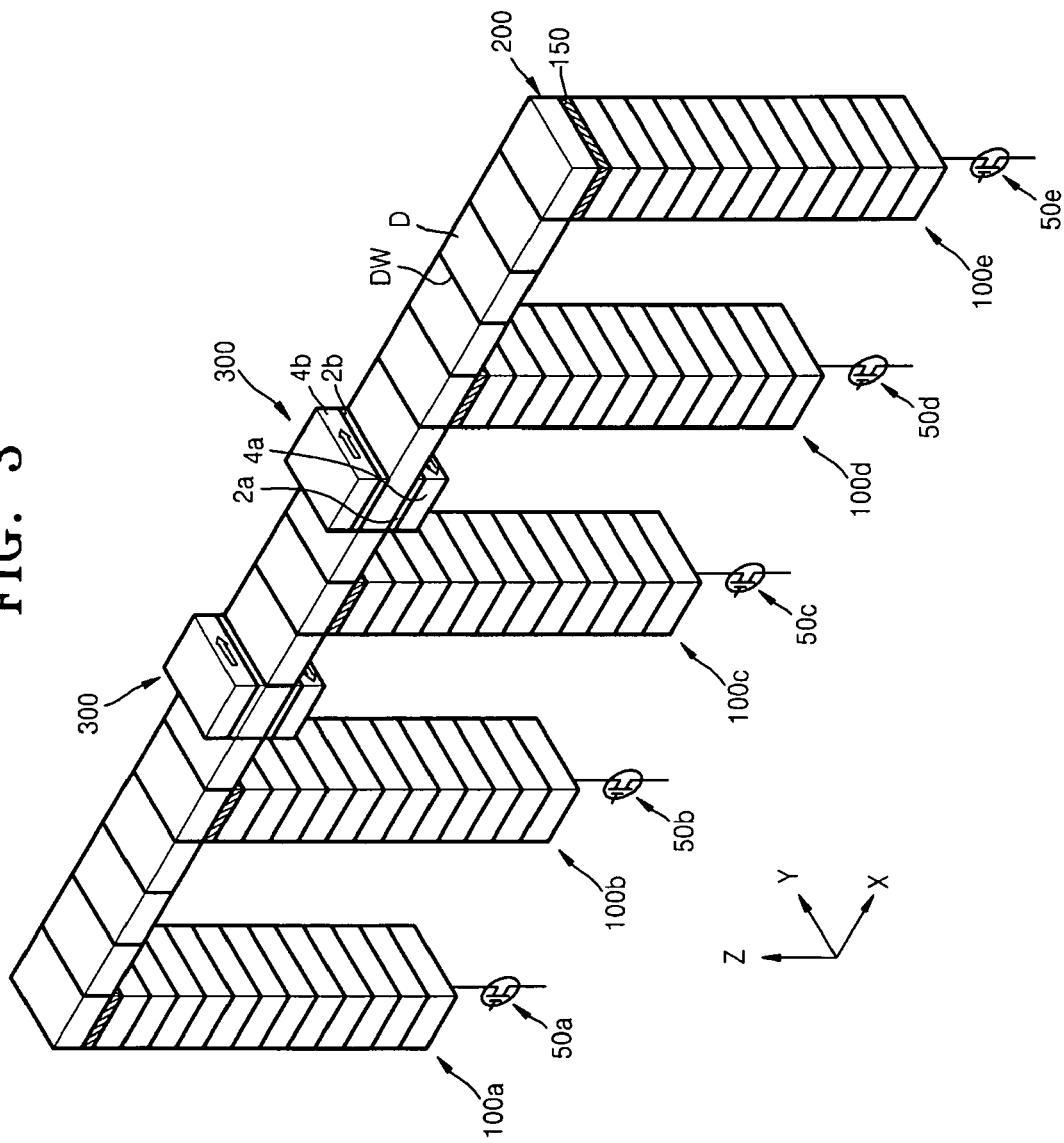
FIG. 3 is a schematic perspective view of an example of an information storage device using magnetic domain wall movement according to an example embodiment of the present application.

The perpendicular magnetic track 100 illustrated in FIG. 1A and/or the horizontal magnetic track 200 illustrated in FIG. 1B are used in an information storage device according to an example embodiments of the present application. FIG. 3 is a schematic perspective view of an example of an information storage device using magnetic domain wall movement according to an example embodiment of the present application.

Referring to FIG. 3, the information storage device includes a plurality of perpendicular magnetic tracks 100a through 100e and a horizontal magnetic track 200 connecting the perpendicular magnetic tracks 100a through 100e. Each of the perpendicular magnetic tracks 100a through 100e and the horizontal magnetic track 200 correspond to the perpendicular magnetic track 100 illustrated in FIG. 1A and the horizontal magnetic track 200 illustrated in FIG. 1B, respectively. The perpendicular magnetic tracks 100a through 100e may be spaced apart from one another by a desired and/or predetermined interval and may be disposed in a row. At least one of the perpendicular magnetic tracks 100a through 100e, for example, a perpendicular magnetic track 100c (hereinafter, referred to as a central perpendicular magnetic track) disposed in the center of the perpendicular magnetic tracks 100a through 100e may be a buffer track. The horizontal magnetic track 200 may be disposed on top surfaces of the perpendicular magnetic tracks 100a through 100e so as to connect the perpendicular magnetic tracks 100a through 100e. Respective resistance magnetic layers 150 may be interposed between the perpendicular magnetic tracks 100a through 100e and the horizontal magnetic track 200. The electric resistance of each of the resistance magnetic layers 150 is greater than that of each of the perpendicular magnetic tracks 100a through 100e and the horizontal magnetic track 200. A function of the resistance magnetic layers 150 will be described later.

Reading/writing units 300 may be disposed on regions of the perpendicular magnetic tracks 100a through 100e or the horizontal magnetic track 200. For example, the respective reading/writing units 300 shown in FIG. 3 are disposed on two portions of the horizontal magnetic track 200. The two reading/writing units 300 shown in FIG. 3 are positioned on different sides of the central perpendicular magnetic track 100c, viewed from above. The central perpendicular magnetic track 100c is disposed in the center of the perpendicular magnetic tracks 100a through 100e and is used as a buffer track according to an example embodiment. The reading/writing units 300 may each be spaced apart from the central perpendicular magnetic track 100c by a desired and/or predetermined interval. Positions where the reading/writing units 300 are formed, and the number of the reading/writing units 300 may be changed without departing from the scope of example embodiments of the present application. An example configuration of the reading/writing units 300 will be described later.

Bottom surfaces of the perpendicular magnetic tracks 100a through 100e may be connected to transistors 50a through 50e, respectively, as shown in FIG. 3. Each of the transistors 50a through 50e is an example of a driving device for moving the magnetic domains Ds and the magnetic domain walls DWs in the perpendicular magnetic tracks 100a through 100e and the horizontal magnetic track 200, and may be formed on a substrate (not shown). According to an example embodiment, two of the transistors 50a through 50e are activated such that a current flows in two of the perpendicular magnetic tracks 100a through 100e and a portion of the horizontal magnetic track 200, wherein the two of the perpendicular magnetic tracks 100a through 100e correspond to the activated two of the transistors 50a through 50e, respectively, and the portion of the horizontal magnetic track 200 connects the two of the perpendicular magnetic tracks 100a through 100e. The magnetic domains Ds and the magnetic domain walls DWs can be moved in the two of the perpendicular magnetic tracks 100a through 100e and the portion of the horizontal magnetic track 200 in response to the current flowing through the two of the perpendicular magnetic tracks 100a through 100e and the portion of the horizontal magnetic track 200. Since a current flows in a direction opposite to a direction in which the electrons move, the magnetic domains Ds and the magnetic domain walls DWs are moved in a direction opposite to a direction in which the current flows. For example, when a current flows from a bottom surface of the central perpendicular magnetic track 100c to a bottom surface of a perpendicular magnetic track 100a (hereinafter, referred to as a first perpendicular magnetic track), which is illustrated as the leftmost track, the magnetic domains Ds can be moved from the first perpendicular magnetic track 100a to the perpendicular magnetic track 100c. Further, when the magnetic domains Ds of the first perpendicular magnetic track 100a are moved to the central perpendicular magnetic track 100c, data can be recorded on the magnetic domains Ds using the reading/writing unit 300, or the data recorded on the magnetic domains Ds can be read using the reading/writing unit 300. Next, the magnetic domains Ds moved to the central perpendicular magnetic track 100c can be moved back to the first perpendicular magnetic track 100a. Throughout this process, data can be recorded on the first perpendicular magnetic track 100a, or the data recorded on the first perpendicular magnetic track 100a can be reproduced. In such a reading/writing operation, the central perpendicular magnetic track 100c may be used as a buffer track on which data is temporally recorded.

The specific resistance of each of the resistance magnetic layers 150 may be 500 through 10000 times, particularly 1000 through 3000 times the specific resistance of each of the perpendicular magnetic tracks 100a through 100e and the horizontal magnetic track 200 according to an example embodiment. To achieve such a difference in specific resistance, the resistance magnetic layers 150 may be formed of at least one selected from a group consisting of amorphous CoZrNb and CoFeB, or combination thereof, or may include impurities such as metalloid a (e.g., Si, B, or the like). Thus, each of the resistance magnetic layers 150 can be a magnetic substance having high specific resistance. According to an example embodiment, two of the transistors 50a through 50e are activated such that a current flows in two of the perpendicular magnetic tracks 100a through 100e and a portion of the horizontal magnetic track 200, wherein the two of the perpendicular magnetic tracks 100a through 100e correspond to the activated two of the transistors 50a through 50e, respectively, and the portion of the horizontal magnetic track 200 connects the two of the perpendicular magnetic tracks 100a through 100e. Then, the magnetic domains Ds and the magnetic domain walls Ds are moved in the two of the perpendicular magnetic tracks 100a through 100e and the portion of the horizontal magnetic track 200. The resistance magnetic layers 150 prevent the current from leaking to an inappropriate portion at least during operation of an information storage device. Since each of the resistance magnetic layers 150 functions as a relatively low electric threshold, a first of the resistance magnetic layers 150, which is positioned in a current path, may allow current flow, but a second of the resistance magnetic layers 150, which is positioned below the current path, reduces and/or prevents the current from leaking to an inappropriate portion.

For example, if transistors 50c and 50a are activated, a current path is created through the perpendicular track 100c, a portion of the horizontal track 200 connecting the perpendicular track 100c with the perpendicular track 100a, and the perpendicular track 100a. As such, the resistance magnetic layer 150 between the perpendicular track 100c and the horizontal track 200, as well as the resistance magnetic layer 150 between the perpendicular track 100a and the horizontal track 200 allow current to flow. However, if a current path is created between transistor 50c and transistor 50a as described in this example, the resistance magnetic layer 150 between the horizontal magnetic track 200 and the perpendicular magnetic track 100b prevents current from leaking into the perpendicular magnetic track 100b. Accordingly, the magnetic domains Ds and the magnetic domain walls DWs can be smoothly moved and controlled due to the current in the information storage device according to example embodiments of the present application.

According to an example embodiment, since the perpendicular magnetic tracks 100a through 100e are connected to the horizontal magnetic track 200, and any one of the perpendicular magnetic tracks 100a through 100e is used as a buffer track, an information storage device capable of storing a large amount of information may be provided. In particular, as described above, since the perpendicular magnetic tracks 100a through 100e and the horizontal magnetic track 200 are each a hard magnetic track, an information storage device having an increased recording density, and reduced power consumption is provided according to example embodiments of the present application.

The reading/writing units 300 may each include first and second ferromagnetic layers 4a and 4b, which are disposed on a bottom surface and a top surface of the horizontal magnetic track 200, respectively. The first and second ferromagnetic layers 4a and 4b are pinned layers having magnetization directions opposite to each other according to an example embodiment. Arrows illustrated in the first and second ferromagnetic layers 4a and 4b indicate magnetization directions thereof. First and second insulating layers 2a and 2b are interposed between the first and second ferromagnetic layers 4a and 4b and the horizontal magnetic track 200, respectively. The first and second insulating layers 2a and 2b may each be an oxide layer with a thin thickness, thereby allowing tunneling to occur through the first and second insulating layers 2a and 2b.

Hereinafter, a writing operation using the reading/writing unit 300 of an information storage device according to an example embodiment of the present application will be described with reference to FIGS. 4A and 4B. Referring to the FIGS. 4A and 4B, sign ⊙ indicates magnetization in a first direction M1, and sign ⊗ indicates magnetization in a second direction M2 opposite to the first direction M1. The second direction M2 is a Y-axis direction corresponding to the direction of the Y-axis arrow illustrated in FIG. 3, and the first direction M1 is a direction opposite to the direction of the Y-axis arrow illustrated in FIG. 3.

Figure 4A:
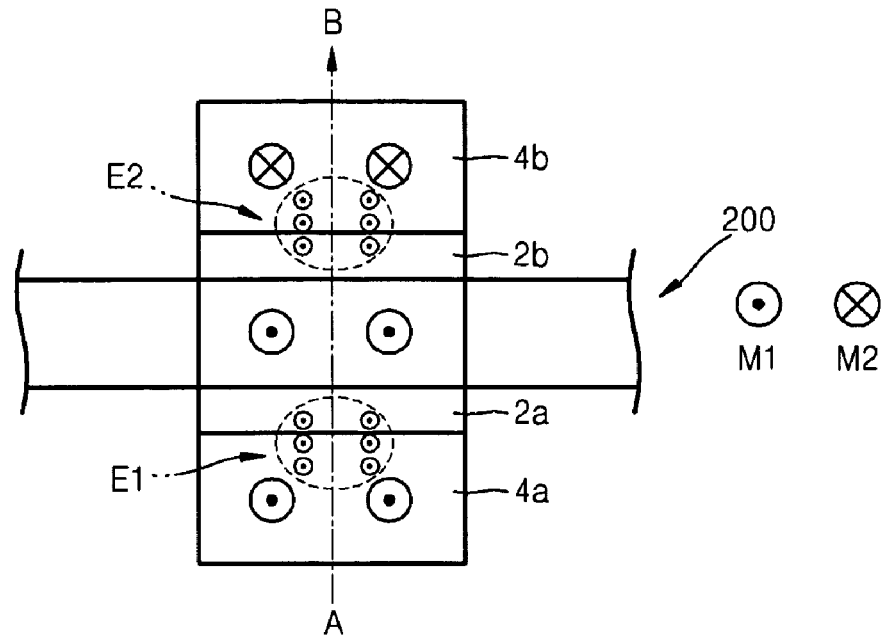
FIGS. 4A and 4B are cross-sectional views for explaining a writing operation using reading/writing units of the example information storage device of FIG. 3 according to an example embodiment of the present application.

Referring to FIG. 4A, when electrons move from a second ferromagnetic layer 4b to a first ferromagnetic layer 4a, that is, when electrons move from "A" to "B", electrons E1 having the same magnetization direction (i.e., the first direction) as the magnetization direction of the first ferromagnetic layer 4a move to the horizontal magnetic track 200 from the first ferromagnetic layer 4a. The electrons E1 magnetize the horizontal magnetic track 200 in the first direction M1. This may be referred to as a spin transfer torque effect.

With regard to the second ferromagnetic layer 4b, electrons having the same magnetization direction (i.e., the second direction) as the magnetization direction of the second ferromagnetic layer 4b get out of and through the second ferromagnetic layer 4b. However, electrons E2 having a magnetization direction opposite to that of the second ferromagnetic layer 4b move back to the horizontal magnetic track 200 to be accumulated in the horizontal magnetic track 200 rather than getting out of and through the second ferromagnetic layer 4b. The electrons E2 magnetize the horizontal magnetic track 200 in the first direction M1. This may be referred to as a spin accumulation effect.

First data can be recorded on the horizontal magnetic track 200 according to the spin transfer torque effect and the spin accumulation effect according to an example embodiment of the present application.

Figure 4B:
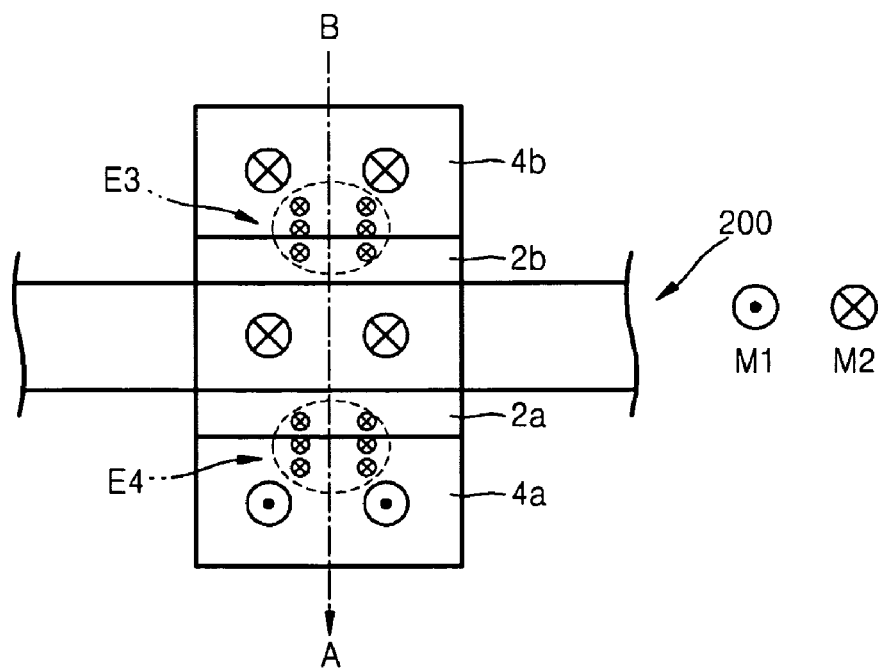

Referring to FIG. 4B, when electrons move from the second ferromagnetic layer 4b to the first ferromagnetic layer 4a, that is, when electrons move from "B" to "A", electrons E3 magnetized in the second direction M2 move to the horizontal magnetic track 200. The electrons E3 magnetize the horizontal magnetic track 200 in the second direction M2. With regard to the first ferromagnetic layer 4a, electrons magnetized in the first direction M1 get out of and through the first ferromagnetic layer 4a. However, electrons E4 magnetized in the second direction M2 move back to the horizontal magnetic track 200 to be accumulated in the horizontal magnetic track 200 rather than getting out of and through the first ferromagnetic layer 4a. The electrons E4 magnetize the horizontal magnetic track 200 in the second direction M2. Accordingly, second data can be recorded on the horizontal magnetic track 200.

In an example embodiment of the present application, since the first and second ferromagnetic layers 4a and 4b are disposed on the bottom surface and the top surface of the horizontal magnetic track 200, respectively, data may be recorded according to the spin transfer torque effect and the spin accumulation effect. Accordingly, a writing current density used and/or required to perform a writing operation is reduced as compared with a case in which one ferromagnetic pinned layer is used. Desired and/or predetermined data may be recorded on the magnetic domain according to the writing principle while the magnetic domains Ds and the magnetic domain walls DWs are being moved on a bit-by-bit basis.

An example embodiment of a reading operation related to the reading/writing units 300 will now be described. In FIG. 3, the electric resistance between one of the first ferromagnetic layer 4a and the second ferromagnetic layer 4b and one of a first end and a second end of the horizontal magnetic track 200 are measured. The electric resistances vary according to data recorded on portions of the horizontal magnetic track 200, at which the reading/writing units 300 are disposed. Accordingly, data recorded on portions of the horizontal magnetic track 200, at which the reading/writing unit 300 is disposed, may be determined by measuring electric resistances. The data may be reproduced while the magnetic domains Ds are being moved on a bit-by-bit basis. When a current flows in the horizontal magnetic track 200 in order to move the magnetic domains Ds and the magnetic domain walls DWs, since each of the first and second insulating layers 2a and 2b function as an electric barrier, the current cannot leak to the first and second ferromagnetic layers 4a and 4b.

Although the reading/writing unit 300 is illustrated as being an integrated type (i.e., a single unit) for reading and writing, example embodiment of the present application are not limited thereto. That is, the reading/writing unit 300 may be built as a separate reading unit and a separate writing unit. In this case, the reading unit may be a giant magneto resistance (GMR) sensor using GMR effect or a tunnel magneto resistance (TMR) sensor using TMR effect, for example. The writing unit may be a GMR or TMR writing unit including one ferromagnetic pinned layer, or a unit performing a writing operation by using an external magnetic field, for example. As another example, the reading/writing units 300 may be used only for a writing operation, and an additional reading unit may be used for a reading operation.

Figure 5A:
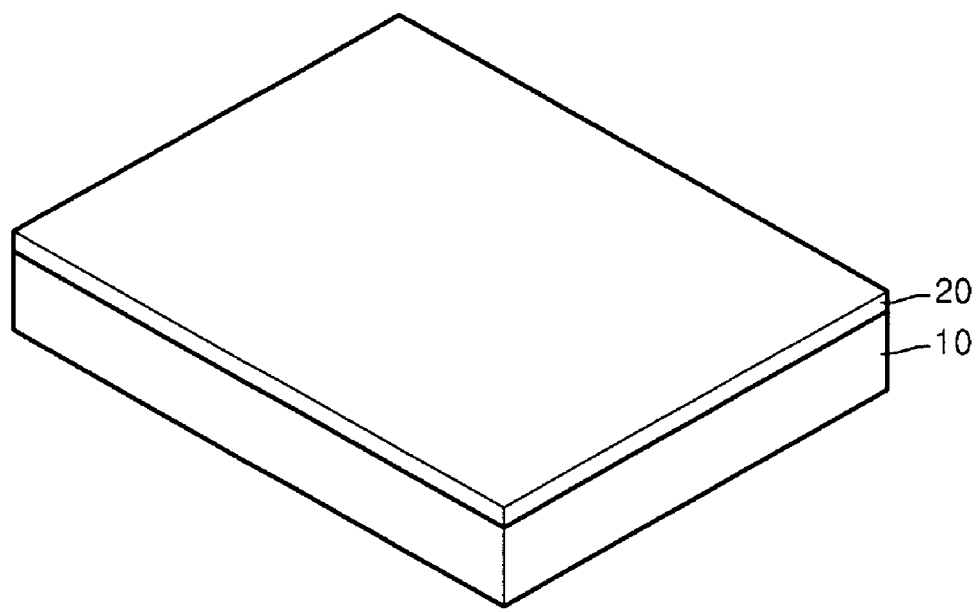
FIGS. 5A through 5C are schematic perspective views for illustrating an example of a method of forming a magnetic layer according to an example embodiment of the present application.
Figure 5B:
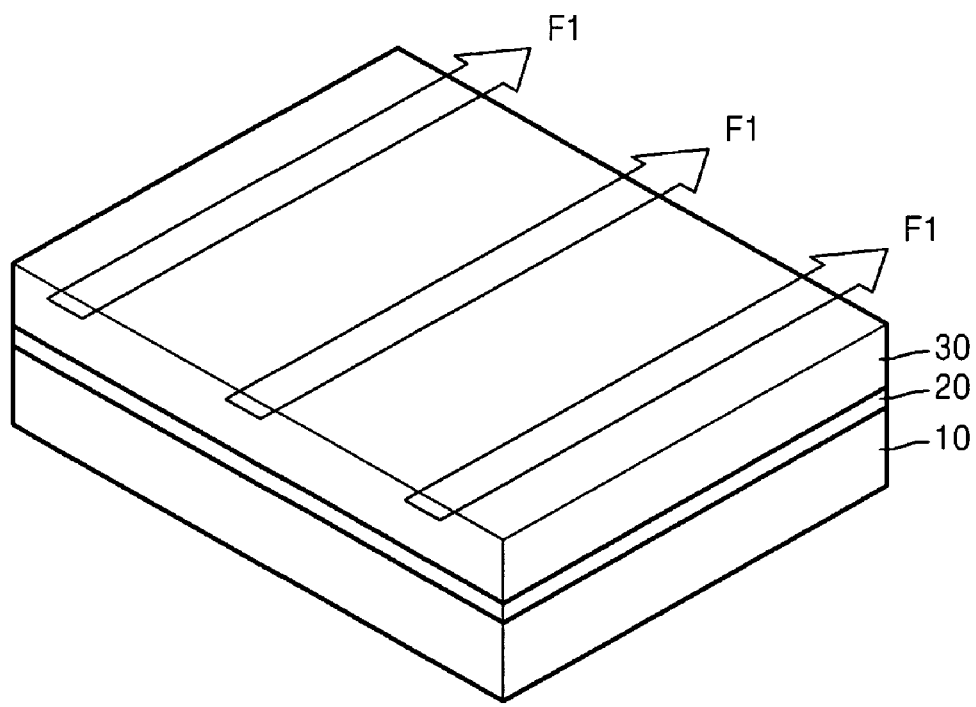
Figure 5C:
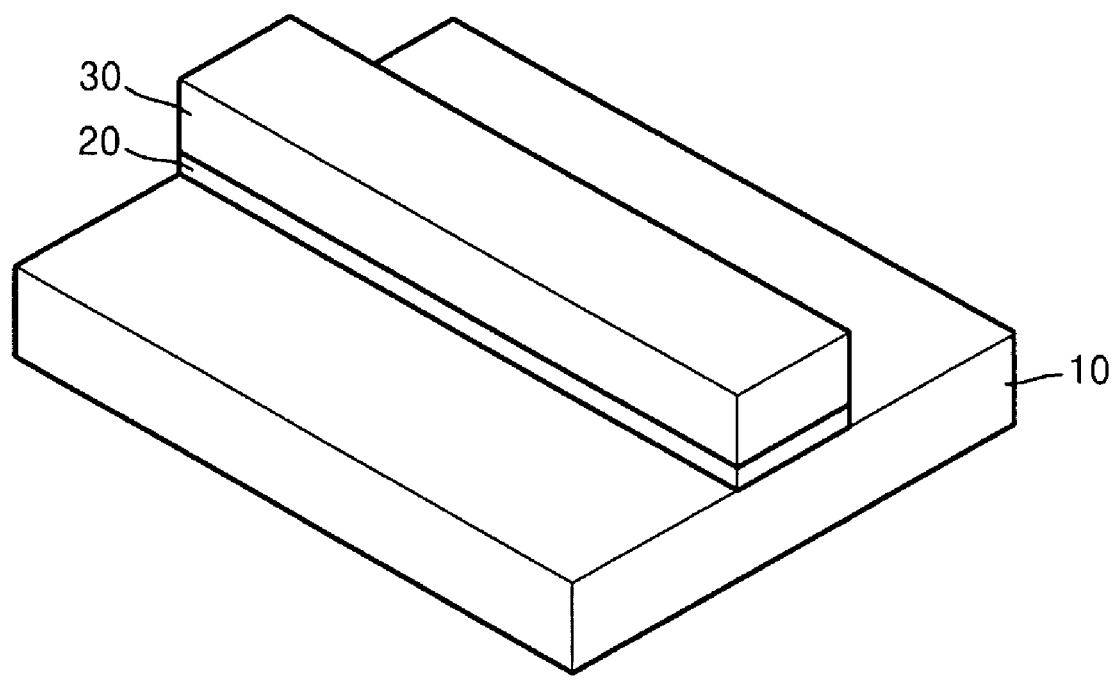

Hereinafter, a method of forming a magnetic layer according to an example embodiment of the present application will now be described. FIGS. 5A through 5C are schematic perspective views for illustrating a method of forming a magnetic layer according to an example embodiment of the present application.

Referring to FIG. 5A, a seed layer 20 is formed on a substrate 10. The seed layer 20 may be a Cr layer or a $Mn_3Si$ layer, for example, but the present invention is not limited thereto. That is, the seed layer 20 may be formed of other materials.

Referring to FIG. 5B, a magnetic layer 30 is formed on the seed layer 20. The magnetic layer 30 may be a hard magnetic material layer with a magnetic anisotropic energy density (Ku) within a range of about $10^4 \leq Ku \leq 10^8$ erg/cc. For example, the magnetic layer 30 may be a Co alloy layer (e.g., a CoCrPt layer, CoCrTaPt layer, or a CoCrTa layer), or a FePt layer having an $L1_0$ crystal structure. When the magnetic layer 30 is formed, a magnetic field F1 is applied in a desired and/or predetermined direction. The direction of the magnetic field F1 may be a direction parallel to the substrate 10, for example, the first direction M1 illustrated in FIG. 4A. Since the magnetic layer 30 is formed on the seed layer 20 when the magnetic field F1 is applied, the magnetic layer 30 may have a magnetization easy-axis having the same direction as that of the magnetic field F1.

In particular, when the seed layer 20 is a Cr layer, and the magnetic layer 30 is a CoCrPt layer, the CoCrPt layer having a hexagonal close packed (HCP) structure can be formed so as to have a surface ($11\bar{2}0$) parallel to the substrate 10, wherein the CoCrPt layer is formed on the Cr layer having a face centered cubic (FCC) structure. This is because the surface ($11\bar{2}0$) has a little lattice mismatch with respect to the Cr layer. The CoCrPt layer has a magnetization easy-axis perpendicular to a surface (0001) that is perpendicular to the surface ($11\bar{2}0$). Accordingly, the CoCrPt layer may have a magnetization easy-axis extending in a direction parallel to the substrate 10. Since the CoCrPt layer may be a polycrystal with a plurality of crystal grains, if a magnetic field F1 is not applied when the CoCrPt layer is formed, the crystal grains can have magnetization easy-axes extending in directions parallel to the substrate 10 but different from one another. Thus, the CoCrPt layer may be formed when the magnetic field F1 having a desired and/or predetermined direction is applied so that the crystal grains have the same magnetization easy-axes. Even when the magnetic layer 30 is a CoCrTaPt layer, a Cr layer may be used as the seed layer 20. In addition, when the magnetic layer 30 is a CoCrTa layer, a $Mn_3Si$ layer having a $DO_3$ structure may be used as the seed layer 20.

As illustrated in FIG. 5C, the magnetic layer 30 and the seed layer 20 may be patterned in a desired and/or predetermined shape, as illustrated in FIG. 5C. The magnetic layer 30 illustrated in FIG. 5C may correspond the horizontal magnetic track 200 illustrated in FIG. 1B.

Various changes in form and details may be made in the method of forming the magnetic layer 30 illustrated in FIGS. 5A through 5C. For example, a hexahedral groove is formed on the substrate in a direction perpendicular to a substrate, and then the magnetic layer 30 is formed in the groove. Thus, the perpendicular magnetic track 100 illustrated in FIG. 1A can be completed. In addition, when the magnetic layer 30 is a FePt layer, the FePt layer is deposited, and then the FePt layer is annealed. During the annealing of the FePt layer, a crystal structure of the FePt layer may be aligned in a desired and/or predetermined direction by using the seed layer 20. To achieve this, the seed layer 20 may have a crystal structure and a lattice constant so that the FePt layer can be crystallized when the FePt layer is annealed, wherein a magnetization easy-axis of the FePt layer extend in a direction parallel to the substrate. In this case, a magnetic track having a magnetization easy-axis extending in a direction parallel to the width of the magnetic track can be obtained without applying a magnetic field F1. In addition, even in the case when the magnetic layer 30 is not a polycrystal but a single crystal, a magnetic track having a magnetization easy-axis extending in a direction parallel to the width of the magnetic track can be obtained without applying the magnetic field F1. An example of the single crystal is GaMnAs doped with Mn in GaAs.

The above-described method of forming a magnetic track can be used for forming the perpendicular magnetic tracks 100a through 100e and the horizontal magnetic track 200 of information storage device of FIG. 3.

Although a few example embodiments of the present application have been shown and described, it would be appreciated by those skilled in the art that these embodiments are only for illustrative purposes and are not intended to limit the scope of the present application. For example, it will be understood by one of ordinary skill in the art that various changes may be made to the configuration illustrated in FIG. 3. For example, various changes may be made to the position and configuration of the reading/writing unit 300, as well as a current supply element connected to a magnetic track. In addition, it will be understood by one of ordinary skill in the art that a notch may be formed as a pinning site on a side surface of the magnetic track. Accordingly, while example embodiments of the present application have been particularly shown and described with reference to example embodiments thereof, it will be understood by one of ordinary skill in the art that various changes in form and details may be made therein without departing from the spirit and scope of the present application.

What is claimed is:

1. A magnetic track layer with a width, the magnetic track layer comprising:
   a hard magnetic material having a magnetization easy-axis extending in a direction parallel to the width of the magnetic track layer, the width of the magnetic track layer being perpendicular to a motion of magnetic domains of the magnetic track layer.

2. The magnetic track layer of claim 1, wherein the magnetic track layer is arranged perpendicular to a substrate.

3. The magnetic track layer of claim 1, wherein the magnetic track layer is arranged horizontally on a substrate.

4. The magnetic track layer of claim 1, wherein a magnetic anisotropic energy density (Ku) of the magnetic track layer is within a range of about $10^4 \leq Ku \leq 10^8$ erg/cc.

5. A method of forming a magnetic track layer, the method comprising:
   forming a seed layer on a substrate;
   forming a magnetic track layer including a hard magnetic material on the seed layer; and
   applying a magnetic field having a first direction parallel to the substrate when the magnetic track layer is formed and being perpendicular to a motion of magnetic domains of the magnetic track layer.

6. The method of claim 5, wherein a magnetic anisotropic energy density (Ku) of the hard magnetic material is within a range of about $10^4 \leq Ku \leq 10^8$ erg/cc.

7. The method of claim 5, wherein the magnetic track layer has a line shape, and the first direction extends in a direction parallel to a width of the magnetic track layer.

8. An information storage device comprising:
a magnetic track having a plurality of magnetic domains;
a current supply element connected to the magnetic track; and
a reading/writing element arranged to at least one of read data from the magnetic track and write data to the magnetic track,
wherein the magnetic track includes a hard magnetic material and has a magnetization easy-axis extending in a direction parallel to a width of the hard magnetic track, the width of the hard magnetic track being perpendicular to a motion of the plurality of magnetic domains.

9. The device of claim 8, wherein the hard magnetic track includes at least one perpendicular magnetic layer arranged perpendicular to a substrate.

10. The device of claim 8, wherein the hard magnetic track includes a horizontal magnetic layer arranged parallel to a substrate.

11. The device of claim 8, wherein the hard magnetic track includes
a plurality of perpendicular magnetic layers, and
at least one horizontal magnetic layer connecting the plurality of perpendicular magnetic layers,
wherein the plurality of perpendicular magnetic layers and the at least one horizontal magnetic layer have magnetization easy-axes parallel to each other.

12. The device of claim 11, wherein at least one of the plurality of the perpendicular magnetic layers is a buffer layer.

13. The device of claim 11, further comprising:
a resistance magnetic layer arranged between each of the plurality of perpendicular magnetic layers and the at least one horizontal magnetic layer,
wherein the resistance magnetic layer has an electric resistance greater than that of each of the plurality of perpendicular magnetic layers and the at least one horizontal magnetic layer.

14. The device of claim 13, wherein the resistance magnetic layer is one of a soft magnetic layer and a hard magnetic layer.

15. The device of claim 8, wherein a magnetic anisotropic energy density (Ku) of the hard magnetic track is within a range of about $10^4 \leq Ku \leq 10^8$ erg/cc.

16. The device of claim 11, wherein the current supply element is a transistor connected to an end of at least one of the plurality of perpendicular magnetic layers.

17. The device of claim 8, wherein the reading/writing element is a single unit configured to both read data and write data from the memory track.

18. The device of claim 17, wherein the single unit comprises:
first and second hard magnetic pinned layers, which are formed on a bottom surface and a top surface of the magnetic track, respectively, and have magnetization directions opposite to each other; and
first and second insulating layers interposed between the first and second hard magnetic pinned layers and the magnetic track, respectively.

19. The device of claim 8, wherein the reading/writing element is a double unit including a writing component configured to only write data and a reading component configured to only read data.

20. A method of manufacturing an information storage device, the method comprising:
forming a magnetic layer including a hard magnetic material;
patterning the magnetic layer into a magnetic track having a plurality of magnetic domains, the hard magnetic material having a magnetization easy-axis extending in a direction parallel to the width of the magnetic track, the width of the magnetic track being perpendicular to a motion of the plurality of magnetic domains of the magnetic track;
connecting a current supply element connected to the magnetic track; and
providing a reading/writing element for reading from and writing data to the magnetic track,
wherein forming the magnetic layer includes,
forming a seed layer on a substrate,
forming the magnetic layer on the seed layer, and
applying a magnetic field having a first direction parallel to the substrate when the magnetic layer is formed.

* * * * *